(12) United States Patent
Lee et al.

(10) Patent No.: US 10,607,832 B2
(45) Date of Patent: Mar. 31, 2020

(54) METHOD AND APPARATUS FOR FORMING A THIN LAYER

(71) Applicant: Samsung Electronics Co., Ltd., Suwon-si, Gyeonggi-do (KR)

(72) Inventors: Junyeong Lee, Bucheon-si (KR); Soonwook Jung, Hwaseong-si (KR); Bongjin Kuh, Suwon-si (KR); Pyung Moon, Seoul (KR); Sukjin Chung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/164,953

(22) Filed: Oct. 19, 2018

(65) Prior Publication Data
US 2019/0221424 A1    Jul. 18, 2019

(30) Foreign Application Priority Data

Jan. 15, 2018 (KR) .......... 10-2018-0004967
Apr. 16, 2018 (KR) .......... 10-2018-0043819

(51) Int. Cl.
*H01L 21/00* (2006.01)
*H01L 21/02* (2006.01)
*H01L 21/3205* (2006.01)
*H01L 21/3105* (2006.01)
*H01L 21/306* (2006.01)

(52) U.S. Cl.
CPC .. *H01L 21/02118* (2013.01); *H01L 21/02211* (2013.01); *H01L 21/02274* (2013.01); *H01L 21/02282* (2013.01); *H01L 21/02304* (2013.01); *H01L 21/32055* (2013.01); *H01L 21/306* (2013.01); *H01L 21/3105* (2013.01)

(58) Field of Classification Search
CPC ......... H01L 21/02118; H01L 21/02211; H01L 21/02274; H01L 21/02282
USPC ........................................... 438/780
See application file for complete search history.

(56) References Cited

U.S. PATENT DOCUMENTS

| 5,902,127 A * | 5/1999 | Park .................. H01L 21/76232 |
| | | 438/435 |
| 5,948,467 A | 9/1999 | Nguyen et al. |
| 6,812,135 B2 | 11/2004 | Li et al. |
| 7,541,297 B2 * | 6/2009 | Mallick ................. C23C 16/045 |
| | | 257/E21.279 |
| 8,445,317 B2 | 5/2013 | Jeong et al. |
| 9,758,865 B2 | 9/2017 | Hasebe et al. |

(Continued)

FOREIGN PATENT DOCUMENTS

| JP | 2003-115532 A | 4/2003 |
| JP | 6010161 B2 | 10/2016 |
| JP | 2017-085164 A | 5/2017 |

*Primary Examiner* — Vu A Vu
(74) *Attorney, Agent, or Firm* — Sughrue Mion, PLLC

(57) ABSTRACT

Disclosed are method and apparatus for forming a thin layer. The method for forming the thin layer comprises providing a substrate including patterns, forming a bonding layer on the substrate covering an inner surface of a gap between the patterns, forming a preliminary layer on the bonding layer filling the gap; and thermally treating the preliminary layer to form the thin layer. The bonding layer is a self-assembled monomer layer formed using an organosilane monomer. The preliminary layer is formed from a flowable composition comprising polysilane.

18 Claims, 9 Drawing Sheets

(56) References Cited

U.S. PATENT DOCUMENTS

| | | | |
|---|---|---|---|
| 2006/0251795 A1* | 11/2006 | Kobrin | A61L 27/34 427/2.1 |
| 2017/0018455 A1 | 1/2017 | Underwood et al. | |
| 2017/0137943 A1 | 5/2017 | Mohn et al. | |
| 2018/0126705 A1* | 5/2018 | Adib | B32B 7/06 |

* cited by examiner

METHOD AND APPARATUS FOR FORMING A THIN LAYER

CROSS-REFERENCE TO RELATED APPLICATION

This U.S. nonprovisional application claims priority under 35 U.S.C. § 119 to Korean Patent Application Nos. 10-2018-0004967 filed on Jan. 15, 2018 and 10-2018-0043819 filed on Apr. 16, 2018 in the Korean Intellectual Property Office, the entire contents of which are hereby incorporated by reference.

FIELD

Inventive concepts relate to a method and apparatus for forming a thin layer.

BACKGROUND

It is essential to form fine patterns in manufacturing highly-integrated semiconductor devices. The size of individual devices needs to minimize in order to integrate many devices within a small area, and thus it may be necessary to reduce a pitch corresponding to a sum of the width of each pattern to be formed and the interval between adjacent patterns. As design rules for semiconductor devices have recently been rapidly reduced, research is being vigorously conducted on process technology for manufacturing semiconductor devices using fine-pitch patterns.

SUMMARY

Some embodiments of inventive concepts provide a method and apparatus for forming a thin layer, in which the occurrence of defects is reduced in the thin layer filling a gap between patterns.

According to exemplary embodiments of inventive concepts, a method for forming a thin layer may include: providing a substrate including patterns; forming a bonding layer on the substrate covering an inner surface of a gap between the patterns; forming a preliminary layer on the bonding layer to fill the gap; and thermally treating the preliminary layer to form the thin layer, wherein the bonding layer is a self-assembled monomer layer formed using an organosilane monomer and wherein the preliminary layer is formed from a flowable composition including polysilane.

According to exemplary embodiments of inventive concepts, a method for forming a thin layer may include: foaming a bonding layer on a substrate; forming a preliminary layer on the bonding layer; and thermally treating the preliminary layer to faun a silicon layer, wherein the bonding layer is a self-assembled monomer layer formed using an organosilane monomer, and wherein the preliminary layer is formed from a flowable composition including polysilane.

According to exemplary embodiments of inventive concepts, an apparatus for forming a thin layer may include: a first process chamber in which a first coating process is performed; a first supply line associated with the first process chamber for supplying a liquid composition into the first process chamber; a first bake chamber in which a first bake process is performed; a second process chamber in which a second coating process is performed; a second supply line associated with the second process chamber for supplying a gaseous source gas into the second process chamber; and a second bake chamber in which a second bake process is performed, wherein the first process chamber, the first bake chamber, the second process chamber, and the second bake chamber are be connected to each other through a buffer module.

DETAILED DESCRIPTION OF EMBODIMENTS

It will be described below in detail exemplary embodiments of inventive concepts in conjunction with the accompanying drawings.

Figure 1:
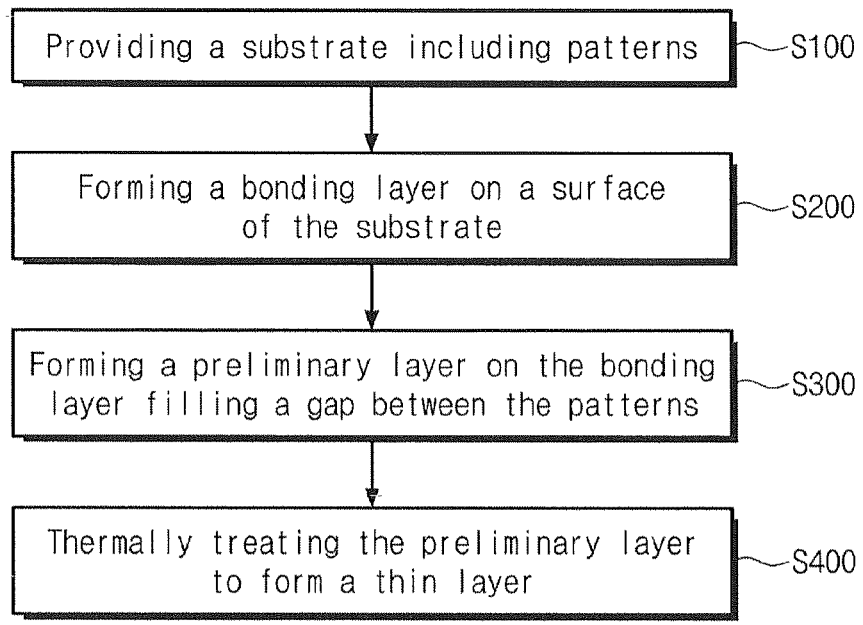
FIG. 1 illustrates a flow chart showing a method for forming a thin layer, according to exemplary embodiments of inventive concepts.
Figure 2:
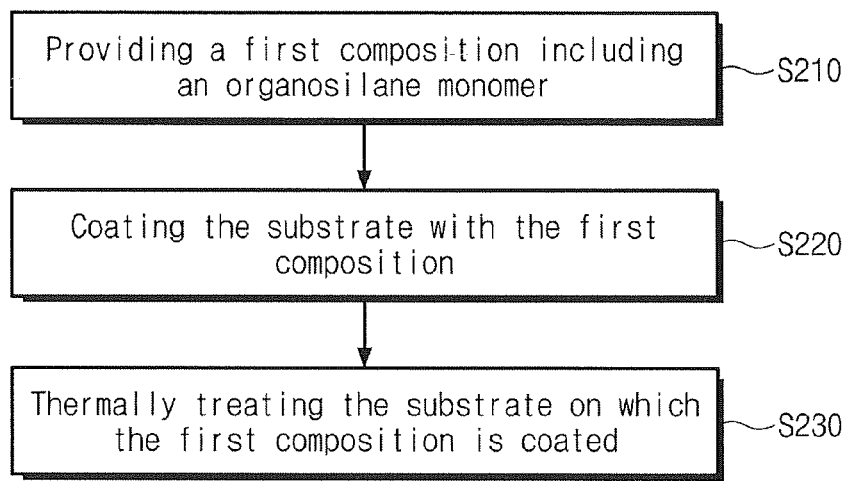
FIG. 2 illustrates a flow chart showing in detail a step of S200 in FIG. 1.
Figure 3:
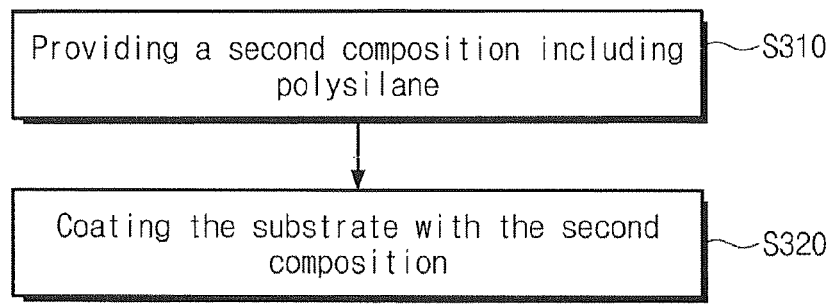
FIG. 3 illustrates a flow chart showing a step of S300 in FIG. 1 according to exemplary embodiments of inventive concepts.
Figure 4:
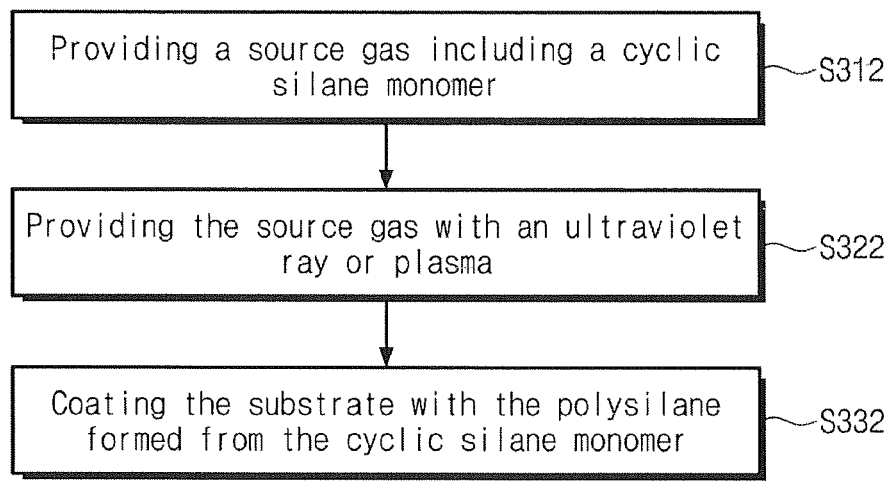
FIG. 4 illustrates a flow chart showing a step of S300 in FIG. 1 according to exemplary embodiments of inventive concepts.

FIG. 1 illustrates a flow chart showing a method for forming a thin layer, according to exemplary embodiments of inventive concepts. FIG. 2 illustrates a flow chart showing in detail a step of S200 in FIG. 1. FIG. 3 illustrates a flow chart showing a step of S300 in FIG. 1 according to exemplary embodiments of inventive concepts. FIG. 4 illustrates a flow chart showing a step of S300 in FIG. 1 according to exemplary embodiments of inventive concepts. FIGS. 5, 6, 8, and 9 illustrate cross-sectional views showing a method for forming a thin layer, according to exemplary embodiments of inventive concepts. FIGS. 7A and 7B illustrate enlarged views showing section A of FIG. 6.

Figure 5:
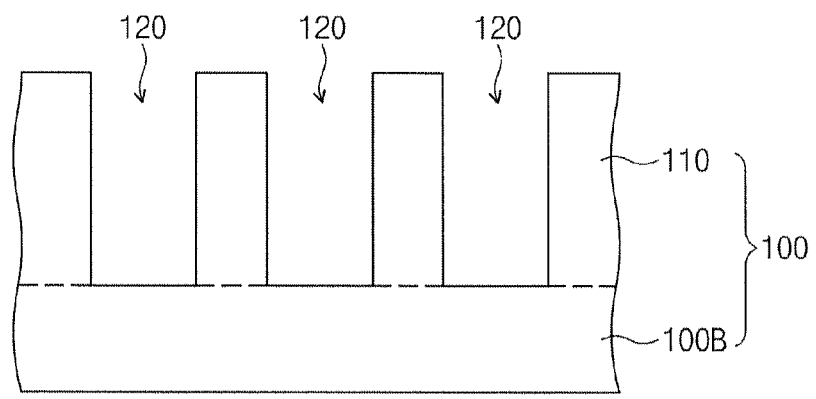
FIGS. 5, 6, 8, and 9 illustrate cross-sectional views showing a method for forming a thin layer, according to exemplary embodiments of inventive concepts.

Referring to FIGS. 1 and 5, a substrate 100 may be provided to include patterns 110 (S100). The patterns 110 may protrude from a lower portion 100B of the substrate 100. A gap 120 may be defined between the patterns 110. The substrate 100 may include a semiconductor substrate such as a silicon substrate, a germanium substrate, or a silicon-germanium substrate. The substrate 100 may further include an oxide layer (e.g., a silicon oxide layer) formed on a surface thereof.

Figure 6:
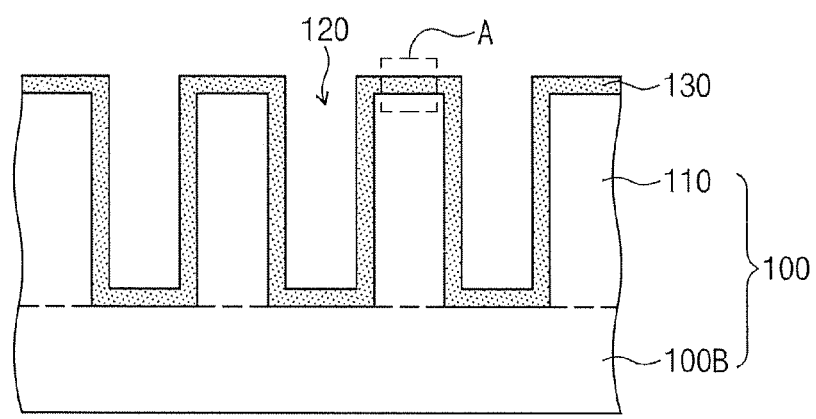
Figure 7A:
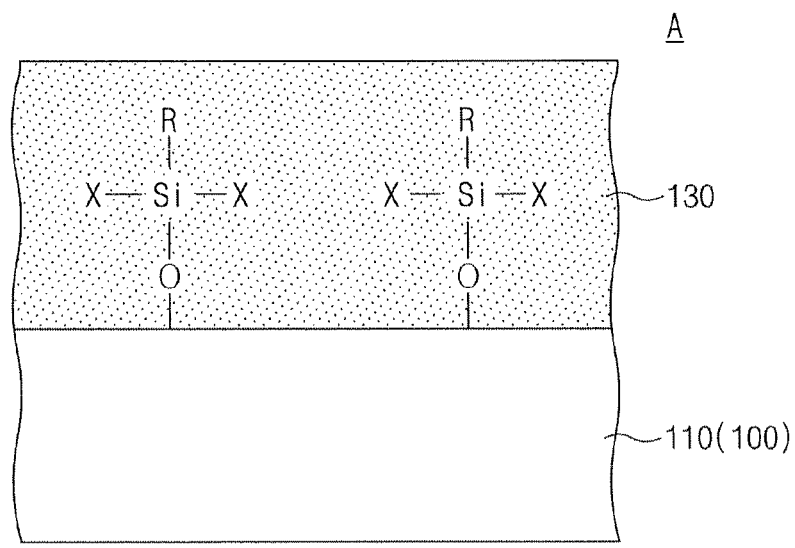
FIGS. 7A and 7B illustrate enlarged views showing section A of FIG. 6.
Figure 7B:
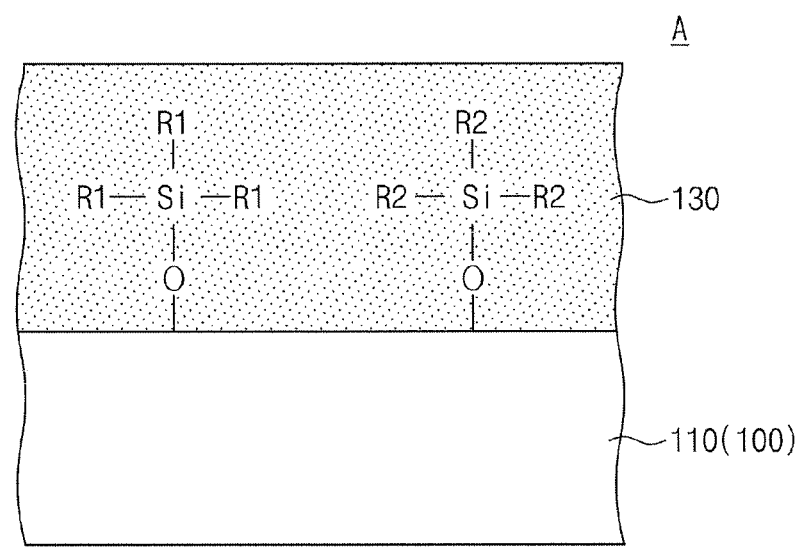

Referring to FIGS. 1 and 6, a bonding layer 130 may be formed on the surface of the substrate 100 (S200). The bonding layer 130 may conformally cover surfaces of the patterns 110 and also cover the surface of the substrate 100 between the patterns 110. The bonding layer 130 may conformally cover an inner surface of the gap 120 and partially fill the gap 120. The bonding layer 130 may be a self-assembled monolayer that is formed using an organosilane monomer.

For example, referring to FIG. 2, the formation of the bonding layer 130 may include performing a first coating process. The first coating process may include providing the substrate 100 of FIG. 5 with a first composition including the organosilane monomer (S210) and coating the first composition on the substrate 100 of FIG. 5 (S220). For example, a spin coating method may be used to perform the first coating process.

The organosilane monomer may be expressed by Chemical Formula 1 or Chemical Formula 2.

$$R\text{—}SiX_3 \quad \text{[Chemical Formula 1]}$$

In Chemical Formula 1, R is: an alkyl group containing 2 to about 20 carbons; or an alkyl group containing 2 to about 20 carbons, wherein at least one hydrogen is substituted with fluorine (F), and X is Cl, $OCH_3$, or $OC_2H_5$.

$$(R1)_3Si\text{—}NH\text{—}Si(R2)_3 \quad \text{[Chemical Formula 2]}$$

In Chemical Formula 2, each of R1 and R2 is an alkyl group containing 1 to about 20 carbons.

R of Chemical Formula 1 may be bonded to a Si atom through a Si—C bond, and each of R1 and R2 of Chemical Formula 2 may be bonded to a Si atom through a Si—C bond.

The organosilane monomer may be or include, for example, (tridecafluoro-1,1,2,2-tetrahydrooctyl)trichlorosilane (FTS), dodecyl-trichlorosilane (DTS), hexadecyl-trichlorosilane (HTS), octadecyltrichlorosilane (OTS), or hexamethyldisilazane (HMDS). The first composition may further include a solvent. The solvent may include, for example, one or more of propylene glycol ethyl ether (PGEE), propylene glycol methyl ether acetate (PGMEA), propylene glycol methyl ether (PGME), toluene, hexane, ethanol, and deionized water.

The formation of the bonding layer 130 may further include performing a first bake process. The first bake process may include performing a heat treatment process on the substrate 100 on which the first composition is coated (S230). The first bake process may cause the organosilane monomer in the first composition to self-assemble on the surface of the substrate 100.

For example, referring to FIG. 7A, when the organosilane monomer is expressed by Chemical Formula 1, X of Chemical Formula 1 may react with a silanol group (Si—OH) of the substrate 100, and a Si atom of Chemical Formula 1 may combine with a silicon atom of the substrate 100 through a Si—O bond. The organosilane monomer may thus be self-assembled on the surface of the substrate 100, which may result in the formation of the bonding layer 130. For another example, referring to FIG. 7B, when the organosilane monomer is expressed by Chemical Formula 2, an —NH— group of Chemical Formula 2 may react with a silanol group (Si—OH) of the substrate 100, and a Si atom of Chemical Formula 2 may combine with a silicon atom of the substrate 100 through a Si—O bond. The organosilane monomer may thus be self-assembled on the surface of the substrate 100, which may result in the formation of the bonding layer 130. A hydrophobic group (e.g., either R of Chemical Formula 1 or R1 and R2 of Chemical Formula 2) of the organosilane monomer may not participate in the self-assembly reaction of the organosilane monomer. The hydrophobic group (e.g., either R of Chemical Formula 1 or R1 and R2 of Chemical Formula 2) of the organosilane monomer may allow the bonding layer 130 to exhibit hydrophobic characteristics.

The first coating process and the first bake process may be performed under atmospheric pressure or under an atmospheric condition where, for example, $O_2$ and $H_2O$ concentrations are equal to or greater than about 1 ppm. The first bake process may be performed at a temperature equal to or less than about 200° C.

Figure 8:
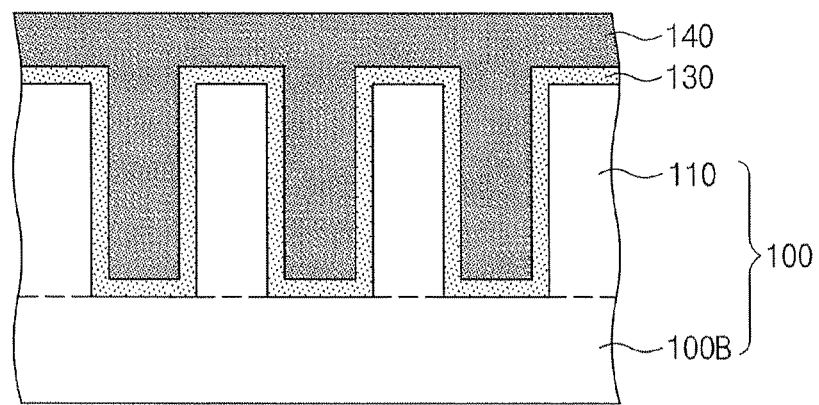

Referring to FIGS. 1 and 8, a preliminary layer 140 maybe formed on the bonding layer 130, filling the gap 120 between the patterns 110 (S300). The preliminary layer 140 may be formed to fill a remaining portion of the gap 120. The preliminary layer 140 may be formed from a flowable composition including polysilane.

For example, referring to FIG. 3, the formation of the preliminary layer 140 may include performing a second coating process. The second coating process may include providing the substrate 100 of FIG. 6 with a second composition including polysilane (S310) and coating the substrate 100 of FIG. 6 with the second composition (S320). For example, a spin coating method may be used to perform the second coating process.

In this case, the polysilane may be expressed by Chemical Formula 3.

$$\text{—}(SiH_2)_n\text{—} \quad \text{[Chemical Formula 3]}$$

In Chemical Formula 3, n, which indicates a degree of polymerization, is an integer from 5 to about 1,000,000.

The polysilane may be, for example, polyhydrosilane ($Si_nH_{2n+2}$, where n is an integer of 5 to about 1,000,000). The polysilane may be obtained by, for example, a ring-opening polymerization of a cyclic silane monomer which will be discussed below. The second composition may further include an organic solvent. The organic solvent may include, for example, one or more of toluene, decalin, cyclohexane, and cyclooctane. The second coating process may form the preliminary layer 140 on the substrate 100.

The second coating process may be performed under an atmospheric condition where $O_2$ and $H_2O$ concentrations are equal to or less than about 1 ppm or under a pressure equal to or less than about 0.1 Torr.

For another example, referring to FIG. 4, the formation of the preliminary layer 140 may include performing a third coating process. The third coating process may include providing the substrate 100 of FIG. 6 with a source gas including a cyclic silane monomer (S312), exposing the source gas to ultraviolet irradiation or plasma (S322), and coating the substrate 100 with the polysilane that is formed from the cyclic silane monomer (S332). For example, a flowable chemical vapor deposition (FCVD) method may be used to perform the third coating process.

The cyclic silane monomer may be expressed by Chemical Formula 4.

$$Si_xH_{2x} \quad \text{[Chemical Formula 4]}$$

In Chemical Formula 4, x is an integer of 3 to about 10.

The cyclic silane monomer may be, for example, $Si_5H_{10}$, $Si_6H_{12}$, $Si_7H_{14}$, or $Si_8H_{16}$. The source gas may further include an inert gas or a hydrogen gas. The inert gas may include, for example, one or more of argon, helium, and nitrogen. The substrate 100 of FIG. 6 may be provided thereon with the cyclic silane monomer in a gaseous state, and the inert gas may serve as a carrier gas for the cyclic silane monomer. The third coating process may be performed at a temperature, for example, equal to or less than about 300° C. to provide the cyclic silane monomer in a gaseous state.

When the source gas is exposed to ultraviolet irradiation or plasma, it may be possible to induce a ring-opening polymerization of the cyclic silane monomer. The polysilane may be formed by the ring-opening polymerization of the cyclic silane monomer. In this case, the polysilane may be expressed by Chemical Formula 5.

[Chemical Formula 5]

In Chemical Formula 5, m is an integer indicating a degree of polymerization.

The polysilane may be, for example, polyhydrosilane ($Si_mH_{2m+2}$, where m is an integer). The degree of polymerization (m) of the polysilane may be controlled such that the melting point of the polysilane is lower than a process temperature of the third coating process and the boiling point of the polysilane is higher than the process temperature of the third coating process. As a result, the polysilane may be formed to have a liquid state with flowability. The polysilane with flowability may be deposited (i.e., by flowable CVD) on the substrate 100 of FIG. 6 during the third coating process, which may result in the formation of the preliminary layer 140.

The degree of polymerization (m) of the polysilane may be adjusted by controlling the intensity and duration time of exposure to ultraviolet irradiation or by controlling the intensity and duration time of exposure to plasma. The third coating process may be performed under an atmospheric condition where $O_2$ and $H_2O$ concentrations are equal to or less than about 1 ppm or under a pressure equal to or less than about 0.1 Torr.

After or during the third coating process, impurities having conductivity may be added into the preliminary layer 140. For example, an ion implantation method (e.g., a plasma ion implantation process) may be performed to add the impurities into the preliminary layer 140. The impurities may include, for example, one or more of phosphorous (P), boron (B), and arsenic (As).

Figure 9:
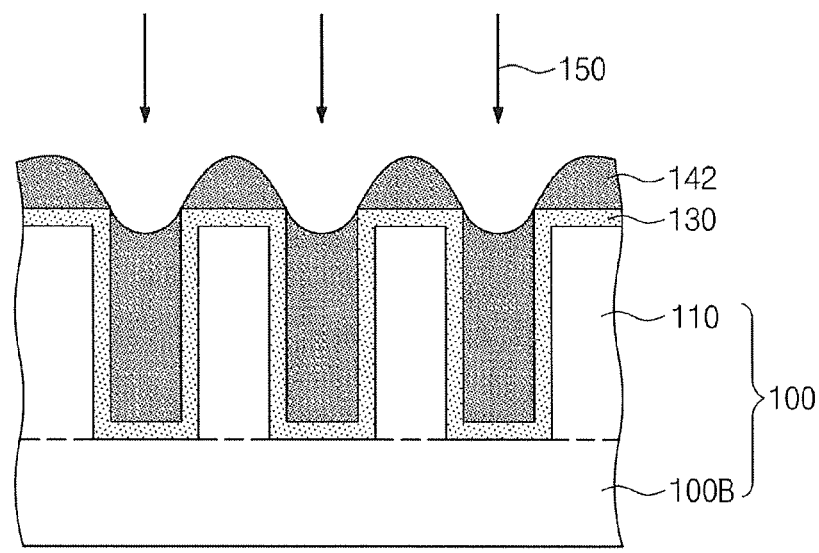

Referring to FIGS. 1 and 9, the preliminary layer 140 may be exposed to a heat treatment process to form a thin layer 142 (S400). The formation of the thin layer 142 may include performing a second bake process 150 to thermally treat the preliminary layer 140. The second bake process 150 may lead to densification of the polysilane in the preliminary layer 140. During the densification of the polysilane, a hydrogen or silane gas may be released from the polysilane and thereby the preliminary layer 140 may shrink. The thin layer 142 may be a silicon layer including the polysilane that has experienced densification. The thin layer 142 may fill the gap 120 between the patterns 110.

When the bonding layer 130 is not formed on the substrate 100 and the preliminary layer 140 is formed directly on the substrate 100 instead, the thin layer 142 may peel off from the substrate 100 because the second bake process 150 shrinks the preliminary layer 140.

According to inventive concepts, before the preliminary layer 140 is formed on the substrate 100, the bonding layer 130 may be formed on the surface of the substrate 100. The bonding layer 130 may exhibit hydrophobic characteristics, and thus may serve as an adhesion promotion layer between the substrate 100 and the preliminary layer 140. In this case, although the preliminary layer 140 may shrink due to the second bake process 150, the presence of the bonding layer 130 may prevent the thin layer 142 from peeling off the substrate 100. Accordingly, the substrate 100 may be provided with the thin layer 142 thereon having fewer defects.

The heat treatment of the preliminary layer 140 may include controlling a process temperature (i.e., a heat treatment temperature) of the second bake process 150 so as to cause the thin layer 142 to have a required crystal structure. When the second bake process 150 is performed at a relatively low temperature (e.g., about 400° C. or less), the thin layer 142 may be formed to have an amorphous state. For example, the thin layer 142 may be an amorphous silicon layer. When the second bake process 150 is performed at a relatively high temperature (e.g., about 400° C. or more), the thin layer 142 may be formed to have a polycrystalline state. For example, the thin layer 142 may be a polycrystalline silicon layer.

When forming the preliminary layer 140 includes the third coating process discussed with reference to FIG. 4, the degree of polymerization (m) of the polysilane may be adjusted such that the boiling point of the polysilane is higher than the process temperature of the second bake process 150. The process temperature of the second bake process 150 may be higher than the process temperature of the third coating process. When the boiling point of the polysilane is lower than the process temperature of the second bake process 150, the polysilane in the preliminary layer 140 may be evaporated during the second bake process 150, and thus it may be difficult to form the thin layer 142. In order to avoid the problem mentioned above, the degree of polymerization-(m) of the polysilane may be adjusted such that the boiling point of the polysilane is higher than the process temperature of the second bake process 150. For example, when the process temperature of the second bake process 150 is about 400° C., the degree of polymerization (m) of the polysilane may be about 10 or higher.

The second bake process 150 may be performed under an atmospheric condition where $O_2$ and $H_2O$ concentrations are equal to or less than about 1 ppm or under a pressure equal to or less than about 0.1 Torr.

As integration of semiconductor devices is increased, the patterns 110 may decrease in pitch and the gap 120 may increase in aspect ratio between the patterns 110. Accordingly, when a thin layer is formed to fill the gap 120, the thin layer may have therein defects such as voids.

According to inventive concepts, the substrate 100 may be provided thereon with the preliminary layer 140 to fill the gap 120 between the patterns 110. The preliminary layer 140 may be formed from a flowable composition, and thermally treated to form the thin layer 142. The flowability of the composition forming the preliminary layer 140 allows the preliminary layer 140 to easily fill the gap 120, and thus it may be possible to reduce or suppress the occurrence of defects, such as voids, in the thin layer 142.

In addition, before the preliminary layer 140 is formed on the substrate 100, the bonding layer 130 may be formed on the surface of the substrate 100. The bonding layer 130 may serve as an adhesion promotion layer between the substrate 100 and the preliminary layer 140. In this case, although the preliminary layer 140 may shrink due to the heat treatment process performed thereon, it may be possible to prevent the thin layer 142 from peeling off the substrate 100.

Accordingly, the occurrence of defects may be reduced or suppressed in the thin layer 142 filling the gap 120 between the patterns 110.

Figure 10:
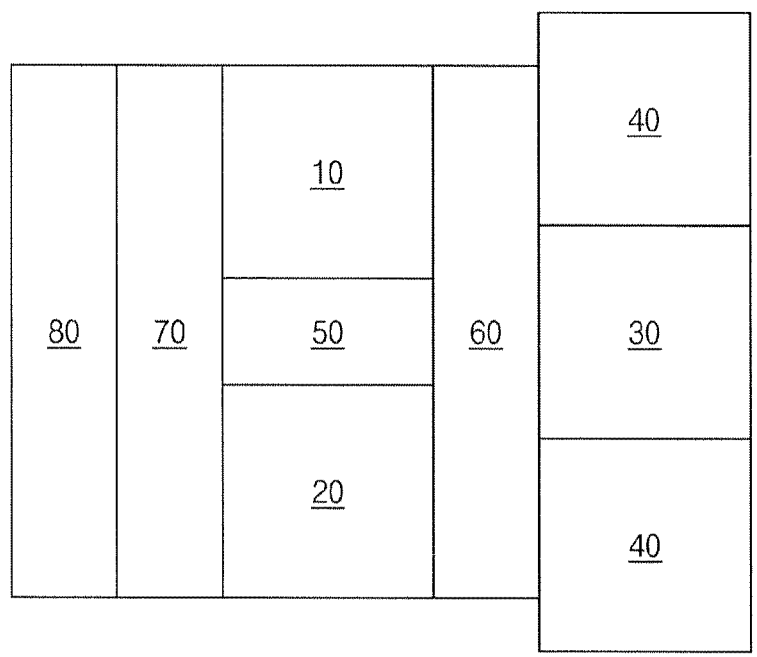
FIG. 10 illustrates a plan view showing an apparatus for forming a thin layer, according to exemplary embodiments of inventive concepts.
Figure 11:
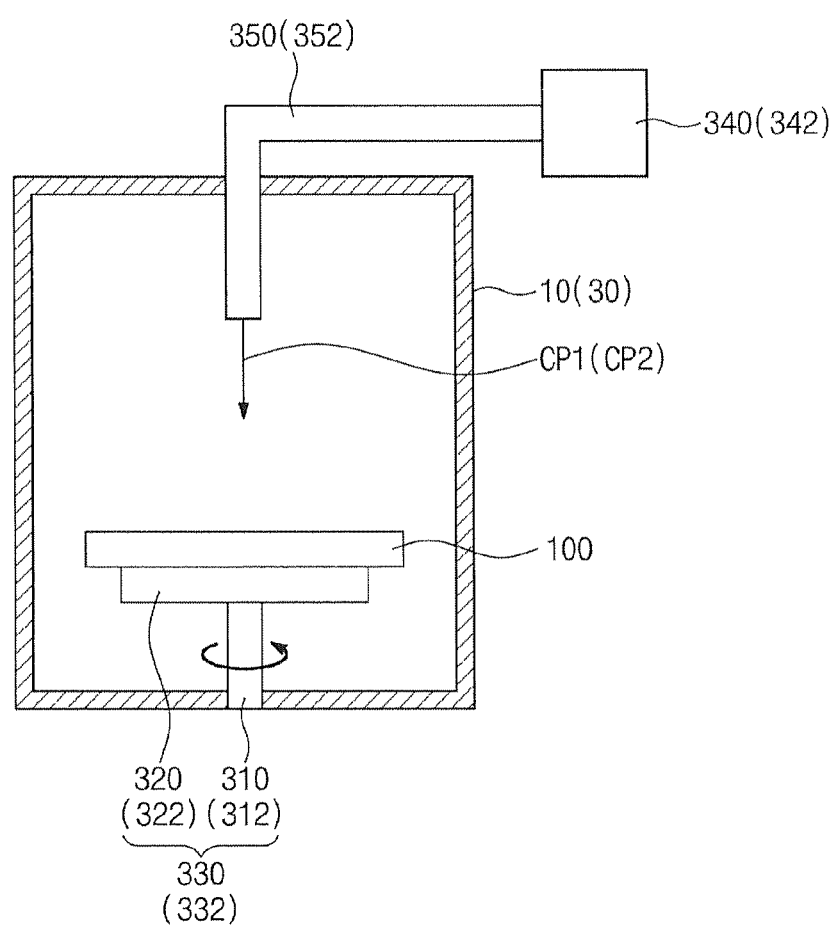
FIG. 11 illustrates a simplified cross-sectional view showing a first process chamber or a second process chamber of FIG. 10.
Figure 12:
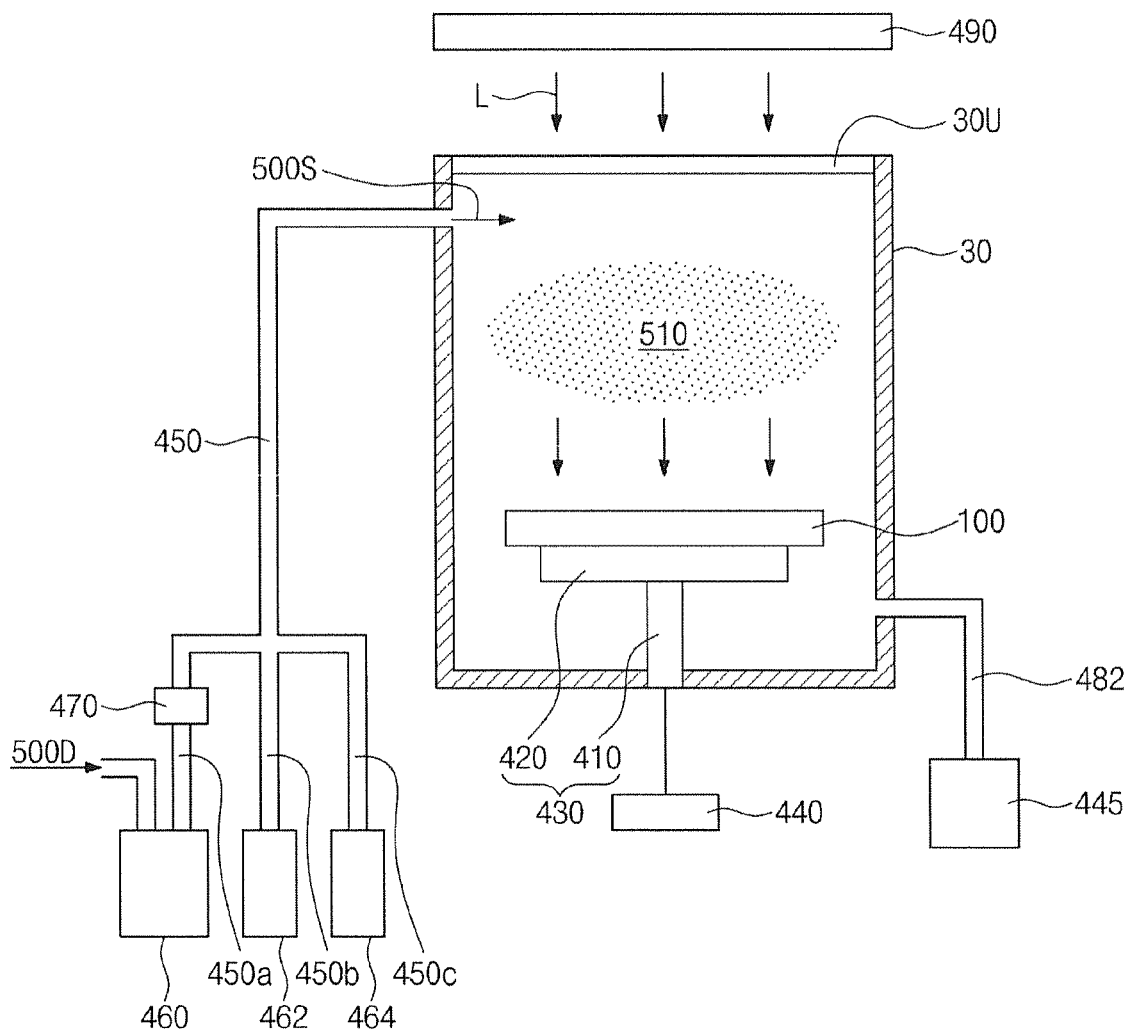
FIGS. 12 and 13 illustrate simplified cross-sectional views showing a second process chamber of FIG. 10.
Figure 13:
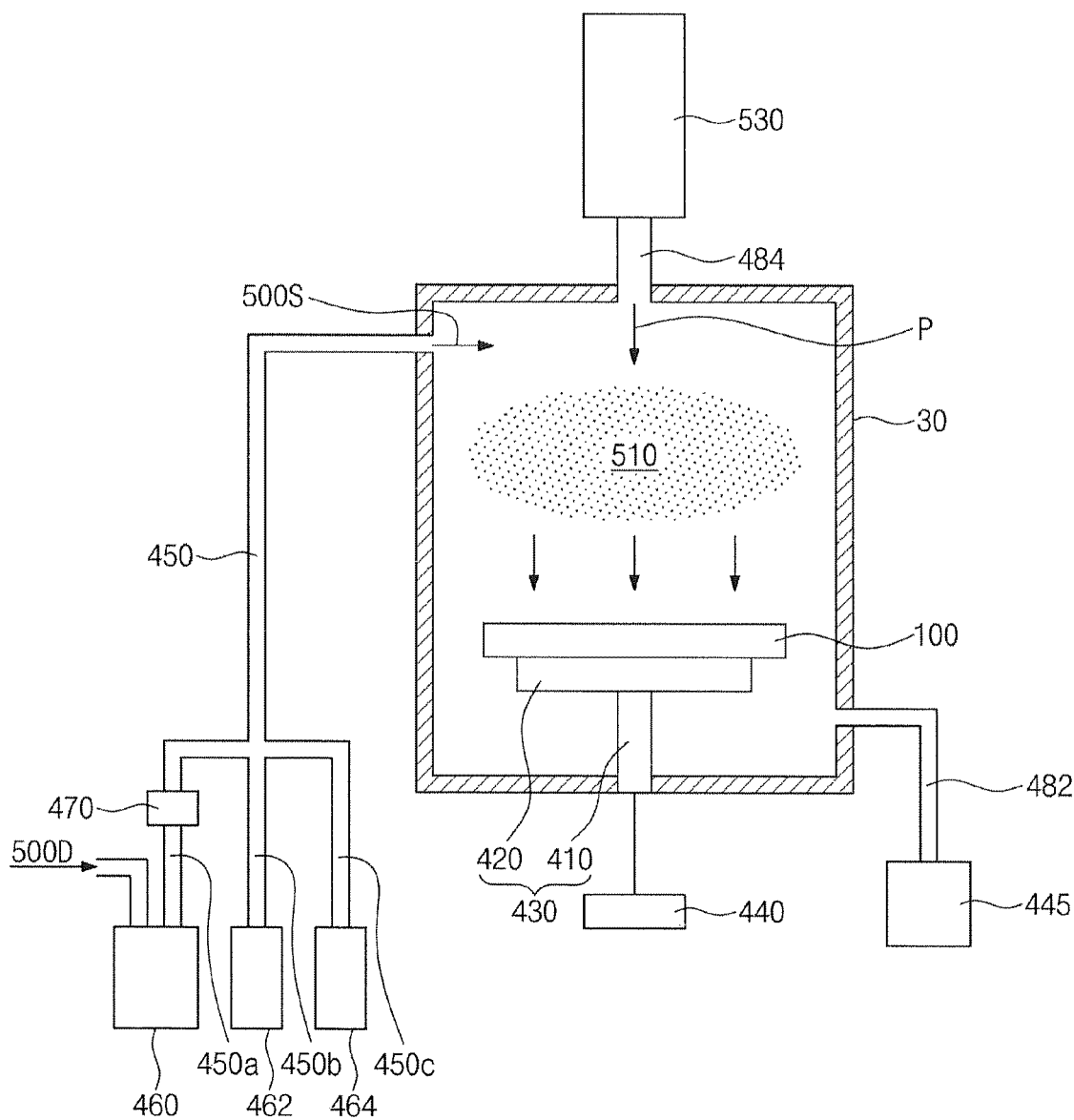

FIG. 10 illustrates a plan view showing an apparatus for forming a thin layer, according to exemplary embodiments of inventive concepts. FIG. 11 illustrates a simplified cross-sectional view showing a first process chamber 10 or a second process chamber 30 of FIG. 10. FIGS. 12 and 13 illustrate simplified cross-sectional views showing the second process chamber 30 of FIG. 10.

Referring to FIG. 10, a thin-layer formation apparatus 1000 may include a first process chamber 10, a first bake chamber 20, a second process chamber 30, and a second bake chamber 40. The second bake chamber 40 may be provided in plural, but inventive concepts are not limited thereto. The thin-layer formation apparatus 1000 may further include a first buffer module 50 connecting the first process chamber 10 and the first bake chamber 20 to each other, and a second buffer module 60 connecting the second process-chamber 30 and the second bake chamber 40 to each other. The first buffer module 50 and the second buffer module 60 may be connected to each other. The thin-layer formation apparatus 1000 may further include a load port module 80 receiving a wafer that is externally provided, and a third buffer module 70 connecting the load port module 80 and the first buffer module 50 to each other. The first buffer module 50 may be interposed between the second buffer module 60 and the third buffer module 70. The wafer may be provided through the load port module 80 into the thin-layer formation apparatus 1000. The wafer may be transferred from the load port module 80 through the third buffer module 70 to the first buffer module 50. The wafer may be provided through the first buffer module 50 into the first process chamber 10 or the first bake chamber 20. The wafer may be provided from the first buffer module 50 through the second buffer module 60 into the second process chamber 30 or the second bake chamber 40. The wafer may be transferred to the load port module 80 through the second buffer module 60, the first buffer module 50, and the third buffer module 70, and released from the load port module 80 to the outside of the thin-layer formation apparatus 1000. Hereinafter, the wafer may be called a substrate.

Referring to FIGS. 10 and 11, the first process chamber 10 may include therein a substrate holder 330 on which a substrate 100 is loaded. The substrate holder 330 may include a stage 320 that loads thereon the substrate 100 and a supporter 310 that supports the stage 320. The supporter 310 may be configured to rotate the stage 320. A supply line 350 may be associated with both the first process chamber 10 and a supply tank 340 provided outside the first process chamber 10.

The first process chamber 10 and the first bake chamber 20 may be used to form the bonding layer 130 discussed above with reference to FIGS. 1 and 6. First, the substrate 100 of FIG. 5 may be provided through the load port module 80 into the thin-layer formation apparatus 1000. The substrate 100 of FIG. 5 may be provided through the third and first buffer modules 70 and 50 into the first process chamber 10. The substrate 100 of FIG. 5 may be loaded on the stage 320. The first coating process discussed above with reference to FIG. 2 may be performed in the first process chamber 10. For example, the substrate 100 of FIG. 5 may be provided thereon with the first composition CP1 including the organosilane monomer. The first composition CP1 may be accommodated in the supply tank 340 and provided through the supply line 350 onto the substrate 100. The first composition CP1 may be spin-coated on the substrate 100. The substrate 100 on which the first composition CP1 is coated may be provided through the first buffer module 50 into the first bake chamber 20. In the first bake chamber 20, the first bake process may be performed to thermally treat the substrate 100 on which the first composition CP1 is coated. The first bake process may be performed at a temperature equal to or less than about 200° C. The first bake process may cause the organosilane monomer in the first composition CP1 to self-assemble on a surface of the substrate 100. The bonding layer 130 may then be formed on the substrate 100. The first coating process and the first bake process may be performed under an atmospheric pressure or under an atmospheric condition where, for example, $O_2$ and $H_2O$ concentrations are equal to or greater than about 1 ppm.

In some embodiments, the second process chamber 30 may be configured substantially the same as the first process chamber 10. The second process chamber 30 may include therein a substrate holder 332 that loads the substrate 100. The substrate holder 332 may include a stage 322 that loads thereon the substrate 100 and a supporter 312 that supports the stage 322. The supporter 312 may be configured to rotate the stage 322. A supply line 352 may be associated with both the second process chamber 30 and a supply tank 342 provided outside the second process chamber 30.

The second process chamber 30 may be used to form the preliminary layer 140 discussed above with reference to FIGS. 1 and 8. First, the substrate 100 of FIG. 6 may be provided through the first and second buffer modules 50 and 60 into the second process chamber 30. The substrate 100 of FIG. 6 may be loaded on the stage 322. The second coating process discussed above with reference to FIG. 3 may be performed in the second process chamber 30. For example, the substrate 100 of FIG. 6 may be provided thereon with the second composition CP2 including the polysilane. The second composition CP2 may be accommodated in the supply tank 342 and provided through the supply line 352 onto the substrate 100. The second composition CP2 may be spin-coated on the substrate 100. The second coating process may form the preliminary layer 140 on the substrate 100. The second coating process may be performed under an atmospheric condition where $O_2$ and $H_2O$ concentrations are equal to or less than about 1 ppm or under a pressure equal to or less than about 0.1 Torr.

In other embodiments, referring to FIGS. 10, 12, and 13, the second process chamber 30 may be configured differently than the first process chamber 10. For example, the second process chamber 30 may include therein a substrate holder 430 that loads the substrate 100 thereon. The substrate holder 430 may include a stage 420 that loads thereon the substrate 100 and a supporter 410 that supports the stage 420. The substrate holder 430 may be engaged with a heater 440, but alternatively the heater 440 may not be provided. A supply line 450 may be associated with both the second process chamber 30 and a plurality of supply tanks 460, 462, and 464 provided outside the second process chamber 30. The supply line 450 may include a plurality of sub-supply lines 450a, 450b, and 450c respectively connected to the plurality of supply tanks 460, 462, and 464. An evaporator 470 may be engaged with a sub-supply line 450a connected to one of the plurality of supply tanks 460, 462, and 464. An exhaust line 482 may be associated with both the second process chamber 30 and a pump 445 provided outside the second process chamber 30. The pump 445 may control an internal pressure of the second process chamber 30.

For example, as illustrated in FIG. 12, an upper part 30U of the second process chamber 30 may be transparent. A lamp array 490 may be provided on the upper part 30U of the second process chamber 30. The lamp array 490 may be an ultraviolet lamp array. The second process chamber 30 may receive a light L (e.g., ultraviolet irradiation) that is emitted from the lamp array 490 and then passes through the upper part 30U of the second process chamber 30.

For another example, as illustrated in FIG. 13, an additional supply line 484 may be associated with both the second process chamber 30 and a plasma generator 530 provided outside the second process chamber 30. The second process chamber 30 may receive plasma P that is generated from the plasma generator 530 and then flows through the additional supply line 484. The plasma P may include an inert ion (e.g., an argon ion).

The second process chamber 30 may be used to form the preliminary layer 140 discussed above with reference to FIGS. 1 and 8. First, the substrate 100 of FIG. 6 may be provided through the first and second buffer modules 50 and 70 into the second process chamber 30. The substrate 100 of FIG. 6 may be loaded on the stage 420. The third coating process discussed above with reference to FIG. 4 may be performed in the second process chamber 30. For example, the substrate 100 of FIG. 6 may be provided thereon with the source gas 500S including the cyclic silane monomer. The source gas 500S may further include the inert gas or the hydrogen gas. The cyclic silane monomer may be accommodated in a first supply tank 460 of the plurality of supply tanks 460, 462, and 464. The inert gas or the hydrogen gas may be accommodated in a second supply tank 462 of the plurality of supply tanks 460, 462, and 464. The inert gas or the hydrogen gas may be used as a carrier gas for the cyclic silane monomer. The first supply tank 460 may be provided therein with an additional inert gas 500D for carrying the cyclic silane monomer. The evaporator 470 may covert the cyclic silane monomer into a gaseous state. Therefore, the source gas 500S may include the gaseous cyclic silane monomer. The source gas 500S may be provided through the supply line 450 into the second process chamber 30. The source gas 500S may be partially purged from the second process chamber 30 through the exhaust line 482 such that the second process chamber 30 may be provided therein with a required amount of the cyclic silane monomer.

The second process chamber 30 may receive the light L (e.g., ultraviolet irradiation) emitted from the lamp array 490, as illustrated in FIG. 12, or the plasma P generated from the plasma generator 530, as illustrated in FIG. 13. It thus may be possible to induce a ring-opening polymerization of the cyclic silane monomer. The polysilane 510 may be formed by the ring-opening polymerization of the cyclic silane monomer. The degree of polymerization of the polysilane 510 may be adjusted by controlling the intensity and duration time of exposure to light L or the intensity and duration time of exposure to plasma P. The degree of polymerization of the polysilane 510 may be adjusted such that the polysilane 510 may convert into a liquid state having flowability. The polysilane 510 having flowability may be coated on the substrate 100. The third coating process may form the preliminary layer 140 on the substrate 100. The third coating process may be performed under an atmospheric condition where $O_2$ and $H_2O$ concentrations are equal to or less than about 1 ppm or under a pressure equal to or less than about 0.1 Torr.

After or during the third coating process, an impurity or impurities having conductivity may be added into the preliminary layer 140. A gas including the impurity or impurities may be accommodated in a third supply tank 464 of the plurality of supply tanks 460, 462, and 464, and provided through the supply line 450 into the second process chamber 30. For example, an ion implantation method (e.g., a plasma ion implantation process) may be performed to add the impurity or impurities into the preliminary layer 140.

Referring back to FIG. 10, the substrate 100 on which the preliminary layer 140 is formed may be provided through the second buffer module 60 into the second bake chamber 40. The second bake process 150 discussed above with reference to FIGS. 1 and 9 may be performed in the second bake chamber 40. The second bake process 150 may include thermally treating the substrate 100 on which the preliminary layer 140 is formed. The second bake process 150 may be performed under an atmospheric condition where $O_2$ and $H_2O$ concentrations are equal to or less than about 1 ppm or under a pressure equal to or less than about 0.1 Torr. The second bake process 150 may lead to densification of the preliminary layer 140, thereby forming the thin layer 142. In some embodiments, as discussed above with reference to FIGS. 12 and 13, when the heater 440 is engaged with the substrate holder 430 of the second process chamber 30, the second bake process 150 may be performed in the second process chamber 30.

The substrate 100, on which the thin layer 142 is formed, may be transferred to the load port module 80 through the second buffer module 60, the first buffer module 50, and the third buffer module 70, and released from the load port module 80 to the outside of the thin-layer formation apparatus 1000.

According to inventive concepts, the substrate 100 may be provided with the preliminary layer 140 thereon to fill the gap 120 between the patterns 110. The flowability of the preliminary layer 140 may cause the preliminary layer 140 to easily fill the gap 120, and thus it may be possible to reduce or suppress the occurrence of defects, such as voids, in the thin layer 142.

In addition, before the preliminary layer 140 is formed on the substrate 100, the bonding layer 130 may be formed on the surface of the substrate 100. The bonding layer 130 may serve as an adhesion promotion layer between the substrate 100 and the preliminary layer 140. In this case, although the preliminary layer 140 may shrink due to the heat treatment process performed thereon, it may be possible to reduce or suppress the peel-off of the thin layer 142 from the substrate 100.

Accordingly, a method and apparatus for forming a thin layer may be provided to reduce or suppress the occurrence of defects in the thin layer 142 filling the gap 120 between the patterns 110.

The aforementioned description provides exemplary embodiments for explaining inventive concepts. Therefore, inventive concepts are not limited to the embodiments described above, and it will be understood by one of ordinary skill in the art that variations in form and detail may be made therein without departing from the spirit and essential features of inventive concepts.

What is claimed is:

1. A method for forming a thin layer, the method comprising:
    providing a substrate comprising patterns;
    forming a bonding layer on the substrate covering an inner surface of a gap between the patterns;
    forming a preliminary layer on the bonding layer to fill the gap; and
    thermally treating the preliminary layer to form the thin layer,
    wherein the bonding layer is a self-assembled monomer layer formed using an organosilane monomer,
    wherein the preliminary layer is formed from a flowable composition comprising polysilane,
    wherein forming the bonding layer comprises:
        coating the substrate with a first composition comrising the organosilane monomer; and
        thermally treating the substrate on which the first composition is coated, and wherein the organosilane monomer is expressed by one of Chemical Formula 1 and Chemical Formula 2:

$$R—SiX_3, \quad \text{[Chemical Formula 1]}$$

wherein R is an alkyl group containing 2 to 20 carbons, or an alkyl group containing 2 to 20 carbons, wherein at least one hydrogen is substituted with fluorine (F), and X is Cl, OCH$_3$, OC$_2$H$_5$; and $$(R1)_3Si—NH—Si(R2)_3, \quad \text{[Chemical Formula 2]}$$

wherein each of R1 and R2 is an alkyl group containing 1 to 20 carbons.

2. The method of claim 1, wherein a silicon (Si) atom in the bonding layer and a silicon atom (Si) in the substrate are combined with each other through an Si—O bond.

3. The method of claim 1, wherein the bonding layer has hydrophobic characteristics.

4. The method of claim 1, wherein forming the preliminary layer comprises coating the substrate with a second composition comprising the polysilane, and
wherein the polysilane is expressed by Chemical Formula 3:

$$—[SiH_2]_n—, \quad \text{[Chemical Formula 3]}$$

wherein n indicates a degree of polymerization and is an integer from 5 to 1,000,000.

5. The method of claim 4, wherein the second composition further comprises an organic solvent.

6. The method of claim 5, wherein the organic solvent comprises one or more of toluene, decalin, cyclohexane, and cyclooctane.

7. The method of claim 1, wherein forming the preliminary layer comprises:
providing the substrate with a source gas comprising a cyclic silane monomer;
exposing the source gas to ultraviolet irradiation or plasma to form the polysilane; and
coating the substrate with the polysilane,
wherein the polysilane is formed by a ring-opening polymerization of the cyclic silane monomer.

8. The method of claim 7, wherein the cyclic silane monomer is expressed by Chemical Formula 4:

$$Si_xH_{2x}, \quad \text{[Chemical Formula 4]}$$

wherein x is an integer of 5 to 10.

9. The method of claim 7, wherein the source gas further comprises an inert gas, and
wherein the source gas comprises the cyclic silane monomer in a gaseous state.

10. The method of claim 7, wherein the polysilane is expressed by Chemical Formula 5:

$$—[SiH_2]_m—, \quad \text{[Chemical Formula 5]}$$

wherein m indicates a degree of polymerization and is an integer,
wherein forming the preliminary layer is performed at a first process temperature, and
wherein the degree of polymerization (m) of the polysilane is controlled such that a melting point of the polysilane is lower than the first process temperature and a boiling point of the polysilane is higher than the first process temperature.

11. The method of claim 10, wherein thermally treating the preliminary layer is performed at a second process temperature, and
wherein the degree of polymerization (m) of the polysilane is controlled such that the boiling point of the polysilane is higher than the second process temperature.

12. The method of claim 7, wherein the polysilane is formed to have a liquid state with flowability.

13. The method of claim 1, wherein thermally treating the preliminary layer comprises controlling a heat treatment temperature so as to cause the thin layer to have a required crystal structure.

14. The method of claim 1, further comprising implanting an impurity having conductivity into the preliminary layer,
wherein implanting the impurity is performed during forming the preliminary layer.

15. A method for forming a thin layer, the method comprising:
forming a bonding layer on a substrate;
forming a preliminary layer on the bonding layer; and
thermally treating the preliminary layer to form a silicon layer,
wherein the bonding layer is a self-assembled monomer layer formed using an organosilane monomer,
wherein the preliminary layer is formed from a flowable composition comprising polysilane, and
wherein forming the bonding layer comprises:
coating on the substrate a first composition comprising the organosilane monomer; and
thermally treating the substrate on which the first composition is coated, and
wherein the organosilane monomer is expressed by one of Chemical Formula 1 and Chemical Formula 2:

$$R—SiX_3, \quad \text{[Chemical Formula 1]}$$

wherein R is am alkyl group containing 2 to 20 carbons, or an alkyl group containing 2 to 20 carbons, wherein at least one hydrogen is substituted with fluorine (F), and X is Cl, OCH$_3$, or OC$_2$H$_5$; and $$(R1)_3Si—NH—Si(R2)_3, \quad \text{[Chemical Formula 2]}$$

wherein each of R1 and R2 is an alkyl group containing 1 to 20 carbons.

16. The method of claim 15, wherein forming the preliminary layer comprises spin-coating a second composition on the substrate,
wherein the second composition comprises the polysilane, and
wherein the polysilane is expressed by Chemical Formula 3:

$$—[SiH_2]_n—, \quad \text{[Chemical Formula 3]}$$

wherein n indicates a degree of polymerization and is an integer from 5 to 1,000,000.

17. The method of claim 15, wherein forming the preliminary layer comprises:
providing a cyclic silane monomer in a gaseous state onto the substrate;
exposing the cyclic silane monomer to ultraviolet irradiation or plasma to form the polysilane; and coating the substrate with the polysilane, and
wherein the polysilane is formed by a ring-opening polymerization of the cyclic silane monomer.

18. The method of claim 17, wherein the cyclic silane monomer is expressed by Chemical Formula 4:

$$Si_xH_{2x},\quad \text{[Chemical Formula 4]}$$

wherein x is an integer of 5 to 10,
wherein the polysilane is expressed by Chemical Formula 5:

$$-\!\!\left[SiH_2\right]_{\overline{m}}, \quad \text{[Chemical Formula 5]}$$

wherein m indicates a degree of polymerization and is an integer,
wherein forming the preliminary layer is performed at a first process temperature, and
wherein the degree of polymerization (m) of the polysilane is controlled such that a melting point of the polysilane is lower than the first process temperature and a boiling point of the polysilane is higher than the first process temperature.

* * * * *